(12) United States Patent
Kim et al.

(10) Patent No.: US 10,490,917 B1
(45) Date of Patent: Nov. 26, 2019

(54) DEVICE FOR DRIVING MOTOR

(71) Applicant: LSIS CO., LTD., Anyang-si, Gyeonggi-do (KR)

(72) Inventors: Hong-Seok Kim, Anyang-si (KR); Dong-Sik Kim, Anyang-si (KR); Chun-Suk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/279,219

(22) Filed: Feb. 19, 2019

(30) Foreign Application Priority Data

May 2, 2018 (KR) .................. 10-2018-0050429

(51) Int. Cl.
| | | |
|---|---|---|
| *H01R 12/00* | (2006.01) | |
| *H01R 12/70* | (2011.01) | |
| *H05K 1/02* | (2006.01) | |
| *H05K 1/14* | (2006.01) | |

(52) U.S. Cl.
CPC ....... *H01R 12/7047* (2013.01); *H05K 1/0215* (2013.01); *H05K 1/14* (2013.01)

(58) Field of Classification Search
CPC ............. H01R 12/7047; H01R 12/716; H01R 12/718; H05K 1/0215; H05K 1/14
USPC ...................... 439/55, 65, 74, 573
See application file for complete search history.

(56) References Cited

U.S. PATENT DOCUMENTS

| | | | |
|---|---|---|---|
| 9,985,366 B2* | 5/2018 | Takeuchi | H01R 12/707 |
| 10,389,212 B2* | 8/2019 | Ishimoto | H02K 11/33 |
| 10,411,377 B2* | 9/2019 | Kawahara | H01R 12/707 |
| 10,418,070 B2* | 9/2019 | Okamoto | G11B 33/122 |
| 2016/0380571 A1 | 12/2016 | Yoshida | |
| 2017/0170583 A1* | 6/2017 | Weale | H01R 12/7088 |

FOREIGN PATENT DOCUMENTS

| | | |
|---|---|---|
| EP | 2469995 A1 | 6/2012 |
| EP | 3211979 A1 | 8/2017 |
| KR | 20170040489 A | 4/2017 |
| KR | 20170099547 A | 9/2017 |

OTHER PUBLICATIONS

Korean Office Action for related Korean Application No. 10-2018-0050429; action dated Jul. 8, 2019; (4 pages).
European Search Report for related European Application No. 19159786.3; action dated Aug. 19, 2019; (9 pages).

* cited by examiner

*Primary Examiner* — Khiem M Nguyen
(74) *Attorney, Agent, or Firm* — K&L Gates LLP

(57) ABSTRACT

The present disclosure relates to a motor-driving device with an improved structure of a circuit module. According to the present disclosure, the boards are coupled to each other via a connector or a bolt. This removes wires use, and reduces an assembly tolerance, thereby to improve the device productivity.

8 Claims, 7 Drawing Sheets

DEVICE FOR DRIVING MOTOR

CROSS-REFERENCE TO RELATED APPLICATION

Pursuant to 35 U.S.C. § 119(a), this application claims the benefit of earlier filing date and right of priority to Korean Application No. 10-2018-0050429, filed on May 2, 2018, in the Korean Intellectual Property Office, the disclosure of which is incorporated herein in its entirety by reference.

TECHNICAL FIELD

The present disclosure relates to a motor-driving device with an improved structure of a circuit module.

BACKGROUND

Generally, a motor-driving device refers to a device that can control a speed of a motor with a high efficiency by varying a voltage and frequency of a power supplied from an external power supply and supplying the power with the varied voltage and frequency to the motor.

FIG. 1 is a perspective view of a conventional motor-driving device. FIG. 2 shows a top view of a conventional power board.

Referring to FIG. 1 and FIG. 2, a conventional motor-driving device may include a base 10, heat-dissipating means 20 disposed below the base 10, and a board assembly 30 disposed above the base 10.

The board assembly 30 includes a power board 31 positioned on the base 10, a cap board 32 (a filter board) disposed on the power board 31, and a control board 33 disposed on side faces of the cap board 32 and power board 31. Though not shown, the board assembly may further include an input/output (IO) board on the cap board 32.

The conventional power board 31 receives power from the IO board (not shown).

Specifically, to supply power to a driver such as a motor, the power board 31 receives AC power from the outside through the IO board, and then converts the AC power into DC power and then rectifies the DC power and then converts the rectified DC power to AC power.

In this connection, referring to FIG. 2, the power from the external power supply may have two types of flows as follows in the motor-driving device.

First, in a main power flow, the AC power input to an input terminal block 1 of the power board 31 is converted trough a rectifying section 2 to DC power including ripple. Thereafter, the DC power smoothed by a DC link of the cap board 32 is again applied to an inverter 3 through a DC terminal 7 of the power board 31. Then, the inverter 3 converts the DC power to AC power and outputs the AC power to an output terminal block 4.

Second, in a signal flow, DC power generated from the DC link 7 may be used as a power source for controlling the motor-driving device. The DC power generated from the DC link 7 may be applied to the control board 33, a gate drive, a sensing and protection circuit 5, and the like.

In this conventional motor-driving device, the power flow and the signal flow may have a noise-vulnerable structure in which an intersection occurs between an output of the rectifying section 2 and an output of the inverter 3, and thus interference therebetween occurs.

Further, the cap board 32 is connected to a grounding screw 6 of the power board through a grounding wire 34 formed on the cap board. The grounding wire 34 connected to the power board 31 extends and is connected to the heat-dissipating means 20.

Such a structure of the conventional motor-driving device may cause malfunction of the device because the grounding wire 34 may absorb a high-frequency noise signal. When the grounding wire 34 touches the heat-dissipating means 20 or the SMPS, a sheath thereof may melt. This may cause power flow or signal flow interruption. Thus, malfunction of the device and burnout of the device may occur.

SUMMARY

In order to solve the problem, a purpose of the present disclosure is to provides a motor-driving device with an improved structure in which the noise-vulnerability structure is removed by separating a power flow path and a signal flow path, thereby to minimize interference between components and to enable miniaturization of the device and to improve durability of the device.

In one aspect of the present disclosure, there is provided a motor-driving device for varying a voltage and frequency of power supplied from an external power source and supplying the varied power to a motor, the device comprising: a middle base; heat-dissipating means disposed below the middle base; a first board disposed above the middle base; power-related components disposed on the first board and in a first region thereof, wherein the power-related components include a power input terminal, a rectifying module, an initial charging circuit, an inverting module, and an output terminal block; signal-related components disposed on the first board and in a second region thereof opposite to the first region, wherein the signal-related components include a switching mode power supply (SMPS), a gate drive circuit, and a sensing and protection circuit; a second board electrically connected to the first board; a direct-current (DC) link stage mounted on the second board, wherein the DC link stage is configured for storing power from the initial charging circuit and for supplying the power to the inverting module or the SMPS; and a third board electrically connected to the first board, wherein the third board is configured for receiving a sign DC link stage DC link stage al from the gate drive circuit, and the sensing and protection circuit.

In one implementation, the second board is disposed below the first board, wherein the DC link stage is mounted on a bottom face of the second board and is adjacent the heat-dissipating means.

In one implementation, the first board and the second board are electrically connected to each other via a first female connector and a first male connector, or are electrically connected to each other via a bolt coupling.

In one implementation, the first board and the third board are electrically connected to each other via a second female connector and a second male connector.

In one implementation, the device further comprises an input/output (IO) board electrically connected to the third board.

In one implementation, the first board and the third board are electrically connected to each other via a second female connector and a second male connector, wherein the third board and the IO board are electrically connected to each other via a third female connector 341 and a third male connector.

In one implementation, the device further include an input board disposed above the first board.

In one implementation, the IO board and the third board are connected to a ground via a third female connector and a third male connector, wherein the third board is connected to a ground via a bolt coupling thereof with the heat-dissipating means, wherein the heat dissipating means is connected to a ground via coupling thereof with the input board through a bolt or metal rod, wherein a grounding terminal block is disposed on the input board, wherein the grounding terminal block is connected to an external ground.

According to the present disclosure, the boards are coupled to each other via a connector or a bolt. This removes wires use, and reduces an assembly tolerance, thereby to improve the device productivity.

Further, In accordance with the present disclosure, the performance of the device may be improved by positioning the power-related elements and the signal-related elements in one region and the other region of the first board respectively in a separating manner, thereby eliminating mutual electrical interference therebetween.

Further, the present disclosure has an effect that the control performance of components temperature may be improved by disposing the second board below the first board and positioning the DC link stage adjacent to the heat dissipating means. Further, the durability of the device is improved. An overall space utilization in the device is also improved, so that the device may be downsized.

Further specific effects of the present disclosure as well as the effects as described above will be described in conduction with illustrations of specific details for carrying out the invention.

DETAILED DESCRIPTION

Figure 1:
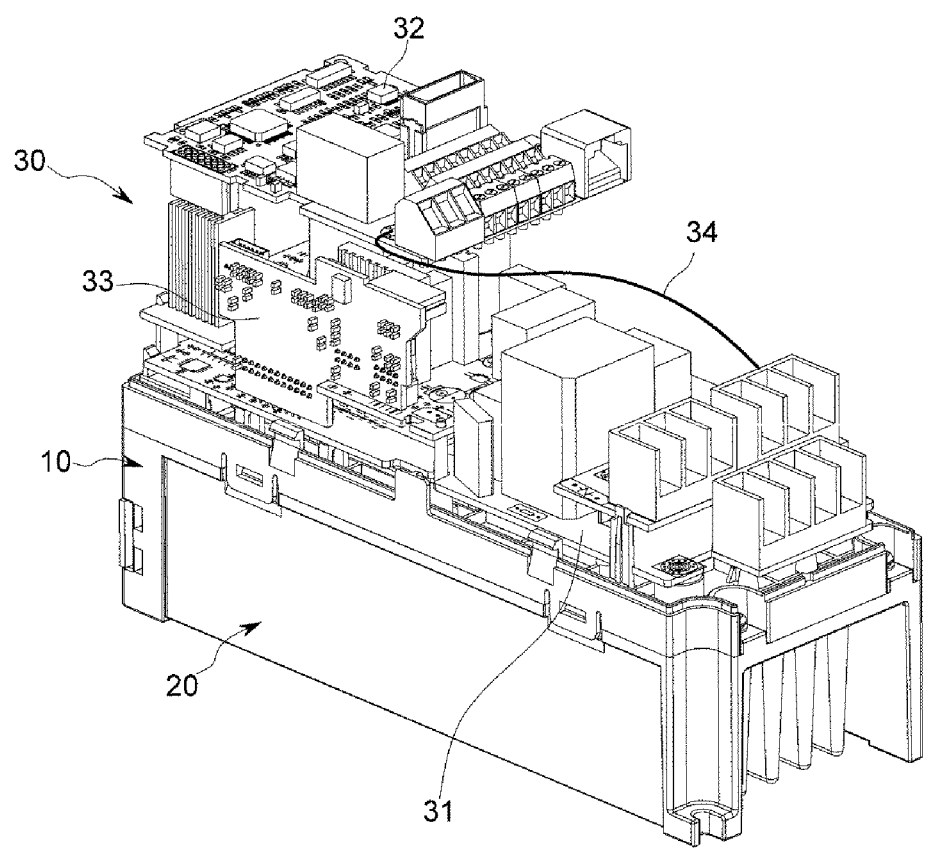
FIG. 1 is a perspective view of a conventional motor-driving device.
Figure 2:
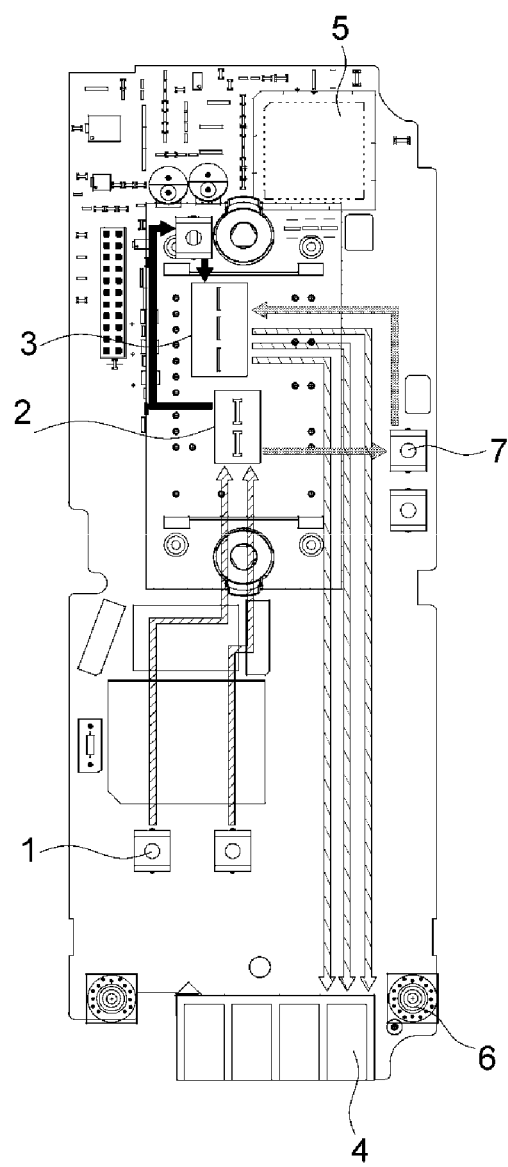
FIG. 2 shows a top view of a conventional power board.

Hereinafter, a motor-driving device with an improved structure in accordance with the present disclosure will be described with reference to the accompanying drawings.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein have the same meaning as commonly understood by one of ordinary skill in the art. When the terms used herein are in conflict with a general meaning of the term, the meaning of the term is in accordance with a definition used herein.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Figure 3:
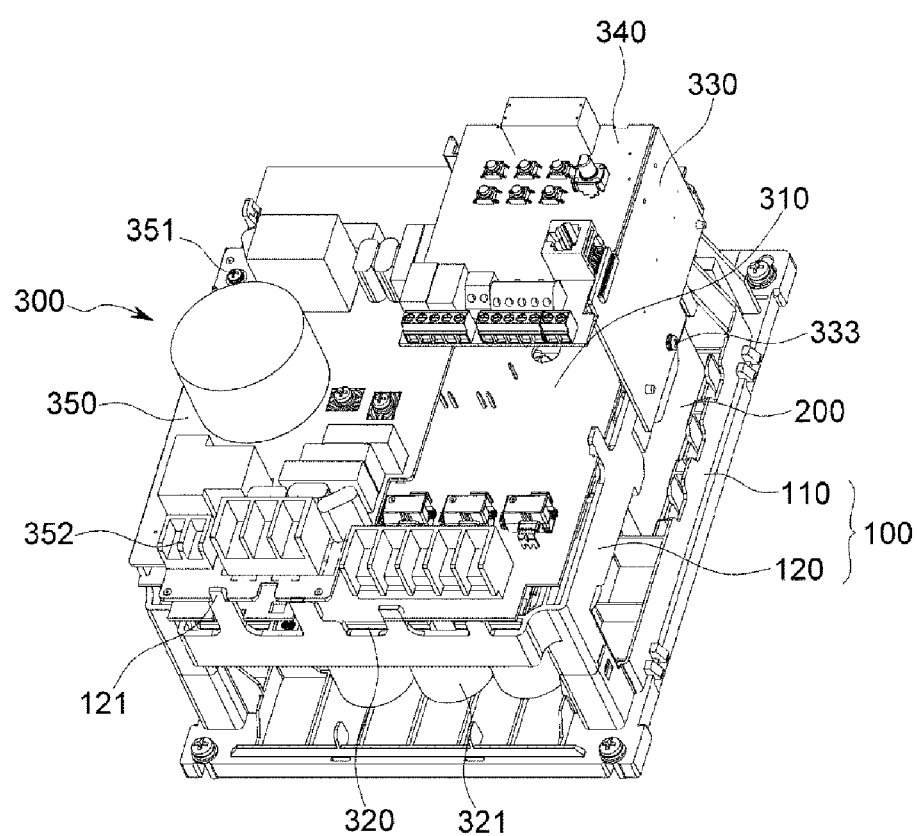
FIG. 3 is a perspective view of a motor-driving device according to an embodiment of the present disclosure.
Figure 4:
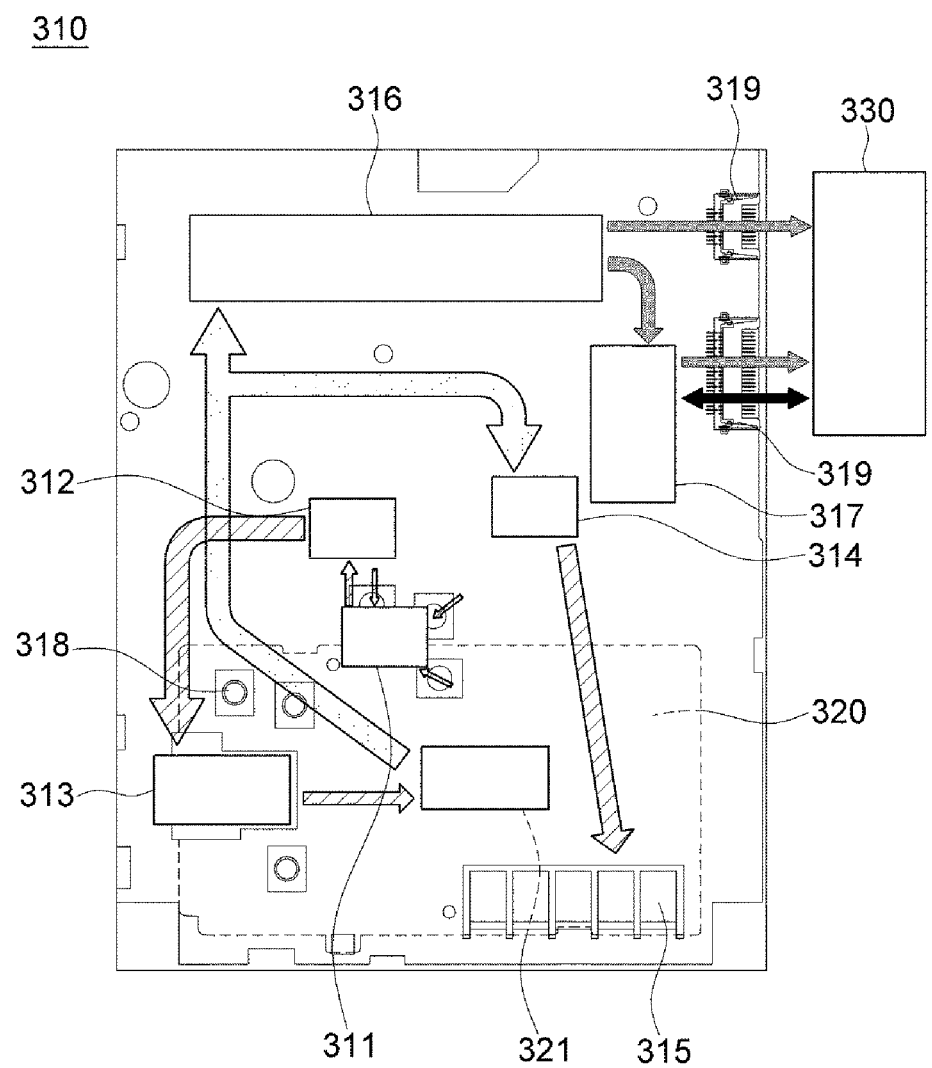
FIG. 4 is a schematic representation of a power flow path and a signal flow path of a motor-driving device according to an embodiment of the present disclosure.
Figure 5:
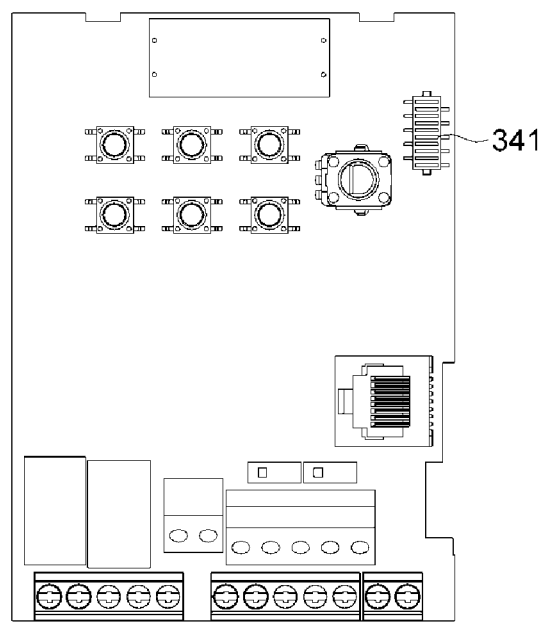
FIG. 5 shows an IO board according to an embodiment of the present disclosure.
Figure 6:
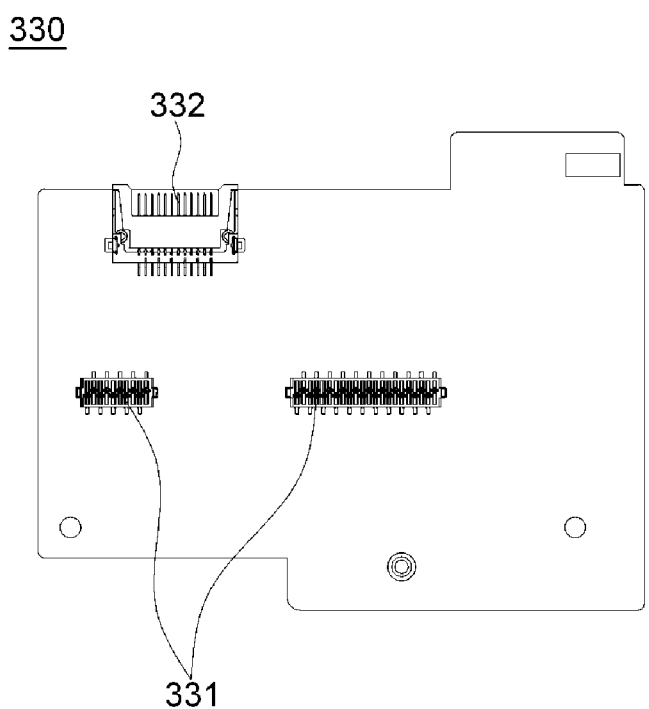
FIG. 6 shows a third board according to an embodiment of the present disclosure.
Figure 7:
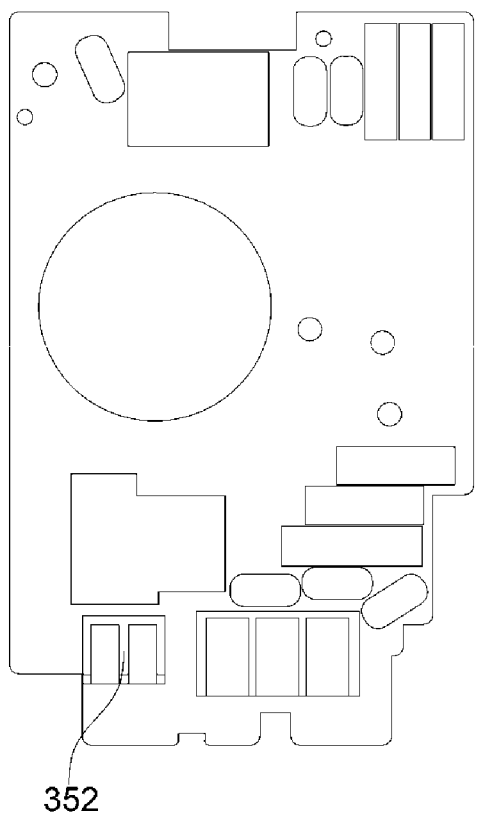
FIG. 7 shows an input board according to an embodiment of the present disclosure.

FIG. 3 is a perspective view of a motor-driving device according to an embodiment of the present disclosure. FIG. 4 is a schematic representation of a power flow path and a signal flow path of a motor-driving device according to an embodiment of the present disclosure. FIG. 5 shows an IO board according to an embodiment of the present disclosure. FIG. 6 shows a third board according to an embodiment of the present disclosure. FIG. 7 shows an input board according to an embodiment of the present disclosure.

Referring to FIG. 3 to FIG. 7, a motor-driving device according to an embodiment of the present disclosure may include a housing 100, heat-dissipating means 200, and a board assembly 300.

The housing 100 may include a lower base 110 and a middle base 120.

The lower base 110 may define a bottom of the motor-driving device. The lower base 110 may be integrally formed with the heat-dissipating means 200 to be described later using injection molding or the like.

The middle base 120 may be spaced from a top face of the lower base 110 by a predetermined spacing. The heat-dissipating means 200 may be disposed below the middle base 120.

The middle base 120 and the heat-dissipating means 200 may be fastened to each other via a hook coupling or bolt coupling 318.

The heat-dissipating means 200 refers to a heatsink. Heat generated from the board assembly 300 disposed on the middle base 120 may be absorbed and discharged out by the heat-dissipating means 200.

The board assembly 300 may include a first board 310, a second board 320, and a third board 330. An IO board 340 and an input board 350 may be further included in the board assembly 300.

The first board 310 may be referred to as a power board, the second board 320 as a cap board, and the third board 330 as a control board.

The first board 310 may be disposed on the middle base 120. In this connection, a fastening pin or fastening hook 121 may be formed on a periphery of the middle base 120 such that the first board 310 is spaced apart from a top face of the middle base 120 by a predetermined distance.

Further, referring to FIG. 4, on the first board 310 and in one region thereof, a power input terminal 311, a rectifying module 312, an initial charging circuit 313, an inverting module 314, and an output terminal block 315 may be mounted. On the first board 310 and in the other region thereof, a Switching Mode Power Supply (SMPS) 316, a gate drive circuit, and a sensing and protection circuit 317 may be mounted.

The second board 320 may be arranged to be electrically connected to the first board 310. A DC link stage 321 that stores power from the initial charging circuit 313 and transfers the power to the inverting module 314 or the SMPS 316 may be mounted on the second board 320.

Further, the second board 320 may be disposed below the first board 310. In this case, the DC link stage 321 may be mounted on a bottom face of the second board 320 so as to be adjacent to the heat-dissipating means 200. Thus, the DC link stage 321 may be mounted in a space between the lower base 110 and the middle base 120.

The third board 330 is electrically connected to the first board 310. The third board 330 may be oriented in a direction perpendicular to a top face of the lower base 110.

The third board 330 may receive a signal from the gate drive circuit, and sensing and protection circuit 317 mounted in the other region of the first board 310.

The IO board 340 may be electrically connected to the third board 330. The user may control on and off of the board 340.

The input board 350 may be located on the first board 310. Via the input board 350, an external power may be input to the motor-driving device.

The boards of the board assembly 300 of the motor-driving device according to an embodiment of the present disclosure may be interconnected as follows.

The first board 310 and the second board 320 may be electrically connected to each other via a first male connector and a first female connector or may be electrically connected to each other via a bolt coupling 318.

The first board 310 and the third board 330 may be electrically connected to each other via a second male connector 319 and a second female connector 331.

The third board 330 and the IO board 340 may be electrically connected to each other via a third male connector 332 and a third female connector 341.

Since each of the first board 310 and the input board 350 is oriented horizontally and the first board 310 and the input board 350 are arranged vertically, the first board 310 and the input board 350 may be connected to each other via mutual coupling between terminals thereof.

A power flow in a power flow path and a signal flow in a signal flow path according to the motor-driving device according to an embodiment of the present disclosure are as follows.

First, the external AC power is input to the input board 350 and then this AC power is applied to the power input terminal 311 of the first board 310.

That is, when the AC power is applied to the power input terminal 311 in one region of the first board 310, the AC power is rectified to the DC power through the rectifying module 312. Thereafter, the DC power is moved to the initial charging circuit 313.

Thereafter, the DC power applied to the initial charging circuit 313 is applied to the DC link stage 321 of the second board 320, and then applied to the inverting module 314 disposed in one region of the first board 310 and to the SMPS 316 disposed in the other region thereof.

Then, the inverting module 314 converts the DC power applied to the inverting module 314 into AC power, which then is applied to an external motor or the like through the output terminal block 315. The DC power applied to the SMPS 316 may be applied to the gate drive circuit, and the sensing and protection circuit 317, and the like, and finally applied to the third board 330 for control of the device.

In brief, the motor-driving device according to an embodiment of the present disclosure includes, in a main power flow path, the rectifying module 312, the initial charging circuit 313, the DC link stage 321, and the inverting module, all of which are mounted in one region of the first board 310. The motor-driving device includes, in the signal flow path, the SMPS 316, the gate drive circuit, and the sensing and protection circuit 317, all of which are mounted in the other region of the first board 310. In this manner, no electrical interference occurs between the components in the power flow path and the signal flow path, thereby reducing the noise.

Furthermore, because the DC link stage 321, which applies the DC power to the components in the power flow path and in the signal flow path, is located on the second board 320, the electrical interference between the components in the power flow path and the signal flow path may be suppressed.

Further, the components in the power flow path and signal flow path are mounted on the single first board 310. The second board 320 on which the DC link stage 321 is mounted may be disposed below the first board 310. This may reduce the size of the device.

Further, a relatively bulky DC link stage 321 is placed adjacent to the heat-dissipating means 200, which may improve miniaturization and heat-dissipating performance of the device.

A grounding structure according to the motor-driving device according to an embodiment of the present disclosure is as follows.

The IO board 340 and third board 330 are connected to a ground via the third female connector 332 and third male connector 341, respectively. The third board 330 is grounded via coupling thereof with the heat-dissipating means 200 via a grounding bolt 333. The heat-dissipating means 200 is connected to a ground via coupling thereof with the input board 350 through a bolt or metal rod 351. Further, a grounding terminal block 352 may be disposed on the input board 350, and the grounding terminal block 352 may be connected to an external ground.

Therefore, since a wire for grounding is unnecessary, the assembling time of the device may be shortened, and a durability of the device may be improved.

In brief, according to the structure of the motor-driving device according to the embodiments of the present disclosure, minimizing the electrical interference between the components in the power flow path and the signal flow path may allow the heat-dissipating performance to be improved and allow the assemblability and durability of the device to be improved.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof

What is claimed is:

1. A motor-driving device for varying a voltage and frequency of power supplied from an external power source and supplying the varied power to a motor, the device comprising:
   a middle base;
   heat-dissipating means disposed below the middle base;
   a first board disposed above the middle base;
   power-related components disposed on the first board and in a first region thereof, wherein the power-related components include a power input terminal, a rectifying module, an initial charging circuit, an inverting module, and an output terminal block;
   signal-related components disposed on the first board and in a second region thereof opposite to the first region, wherein the signal-related components include a switching mode power supply (SMPS), a gate drive circuit, and a sensing and protection circuit;
   a second board electrically connected to the first board;

a direct-current (DC) link stage mounted on the second board, wherein the DC link stage is configured for storing power from the initial charging circuit and for supplying the power to the inverting module or the SMPS; and a third board electrically connected to the first board, wherein the third board is configured for receiving a signal from the gate drive circuit, and the sensing and protection circuit.

2. The motor-driving device of claim 1, wherein the second board is disposed below the first board, wherein the DC link stage is mounted on a bottom face of the second board and is adjacent the heat-dissipating means.

3. The motor-driving device of claim 1, wherein the first board and the second board are electrically connected to each other via a first female connector and a first male connector, or are electrically connected to each other via a bolt coupling.

4. The motor-driving device of claim 1, wherein the first board and the third board are electrically connected to each other via a second female connector and a second male connector.

5. The motor-driving device of claim 1, wherein the device further comprises an input/output (IO) board electrically connected to the third board.

6. The motor-driving device of claim 5, wherein the first board and the third board are electrically connected to each other via a second female connector and a second male connector, wherein the third board and the IO board are electrically connected to each other via a third female connector and a third male connector.

7. The motor-driving device of claim 1, wherein the device further include an input board disposed above the first board.

8. The motor-driving device of claim 7, wherein the IO board and the third board are connected to a ground via a third female connector and a third male connector, wherein the third board is connected to a ground via a bolt coupling thereof with the heat-dissipating means, wherein the heat dissipating means is connected to a ground via coupling thereof with the input board through a bolt or metal rod, wherein a grounding terminal block is disposed on the input board, wherein the grounding terminal block is connected to an external ground.

* * * * *